(12) United States Patent
Newsome

(10) Patent No.: US 9,793,504 B2
(45) Date of Patent: Oct. 17, 2017

(54) ELECTRODE SURFACE MODIFICATION LAYER FOR ELECTRONIC DEVICES

(71) Applicant: Cambridge Display Technology Limited, Godmanchester (GB)

(72) Inventor: Christopher Newsome, St. Ives (GB)

(73) Assignee: Cambridge Display Technology Limited, Godmanchester (GB)

( * ) Notice: Subject to any disclaimer, the term of this patent is extended or adjusted under 35 U.S.C. 154(b) by 0 days.

(21) Appl. No.: 14/905,091

(22) PCT Filed: Jul. 11, 2014

(86) PCT No.: PCT/GB2014/000283
§ 371 (c)(1),
(2) Date: Jan. 14, 2016

(87) PCT Pub. No.: WO2015/008015
PCT Pub. Date: Jan. 22, 2015

(65) Prior Publication Data
US 2016/0149147 A1    May 26, 2016

(30) Foreign Application Priority Data

Jul. 15, 2013 (GB) .................................. 1312609.9

(51) Int. Cl.
*H01L 51/50* (2006.01)
*H01L 51/10* (2006.01)
(Continued)

(52) U.S. Cl.
CPC ........ *H01L 51/105* (2013.01); *H01L 51/0003* (2013.01); *H01L 51/0084* (2013.01);
(Continued)

(58) Field of Classification Search
None
See application file for complete search history.

(56) References Cited

U.S. PATENT DOCUMENTS 6,501,217 B2 * 12/2002 Beierlein ............ H01L 51/5088
313/503
7,384,749 B2 * 6/2008 Kayyem .............. C12Q 1/6825
435/287.2
(Continued)

FOREIGN PATENT DOCUMENTS

WO  WO 2012/080701 A1  6/2012
WO  WO 2013/064791 A1  5/2013

OTHER PUBLICATIONS

International Search Report and Written Opinion mailed Aug. 28, 2014 for Application No. PCT/GB2014/000283.
(Continued)

*Primary Examiner* — Michael Lebentritt
(74) *Attorney, Agent, or Firm* — Wolf, Greenfield & Sacks, P.C.

(57) ABSTRACT

There is disclosed a method for preparing a modified electrode for an organic electronic device, wherein said modified electrode comprises a surface modification layer, comprising: (i) depositing a solution comprising $M(tfd)_3$, wherein M is Mo, Cr or W, and at least one solvent onto at least a part of at least one surface of said electrode; and (ii) removing at least some of said solvent to form said surface modification layer on said electrode.

16 Claims, 2 Drawing Sheets

(51) Int. Cl.
*H01L 51/05* (2006.01)
*H01L 51/00* (2006.01)

(52) U.S. Cl.
CPC ...... *H01L 51/0541* (2013.01); *H01L 51/0545* (2013.01); *H01L 51/0039* (2013.01); *H01L 51/0074* (2013.01)

(56) References Cited

U.S. PATENT DOCUMENTS

| | | | | |
|---|---|---|---|---|
| 2005/0221203 | A1* | 10/2005 | Fujii | H01L 21/28008 430/5 |
| 2010/0200842 | A1* | 8/2010 | Park | B82Y 30/00 257/40 |
| 2011/0266528 | A1* | 11/2011 | Langer | C07D 405/04 257/40 |
| 2012/0148731 | A1* | 6/2012 | Chen | H01M 4/0416 427/77 |
| 2012/0276450 | A1* | 11/2012 | Chen | H01M 4/0416 429/213 |
| 2012/0319050 | A1* | 12/2012 | Metz | C09K 11/06 252/301.16 |
| 2014/0027732 | A1* | 1/2014 | Pyo | H01L 51/506 257/40 |
| 2014/0116509 | A1* | 5/2014 | Vail | H01L 51/002 136/263 |
| 2014/0319428 | A1* | 10/2014 | Blouin | C07D 493/04 252/500 |
| 2015/0021524 | A1* | 1/2015 | Griffiths | H01L 51/0035 252/500 |
| 2016/0233438 | A1* | 8/2016 | Newsome | H01L 51/0074 |

OTHER PUBLICATIONS

International Preliminary Report on Patentability mailed Jan. 19, 2016 for Application No. PCT/GB2014/000283.
Qi et al., Use of a High Electron-Affinity Molybdenum Dithiolene Complex to p-Dope Hole-Transport Layers. J Amer Canc Soc. Aug. 14, 2009;131(35):12530-1.
Tiwari et al., Pentacene organic field-effect transistors with doped electrode-semiconductor contracts. Organic Electron. May 1, 2010;11(5):860-3.
Search Report dated Nov. 18, 2013 for Application No. GB 1312609.9.
Davison, Metal Complexes Derived from cis-1,2-dicyano-1,2-ethylenedithiolate and Bis(Trifluoromethyl)-1,2-dithiete. In Inorganic Syntheses. McGraw-Hill Book Co., New York. 1967;10(1):8-26.

* cited by examiner

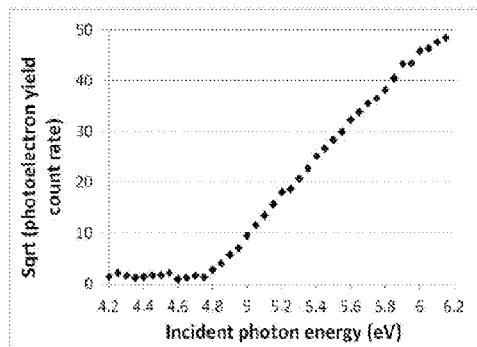
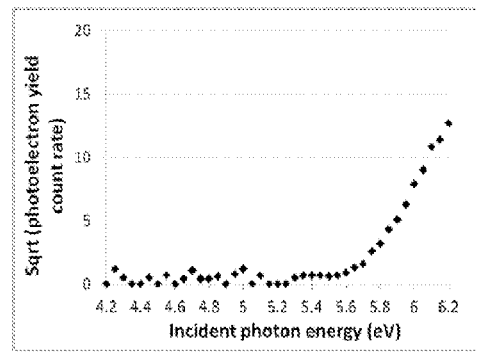
Fig. 3a          Fig. 3b
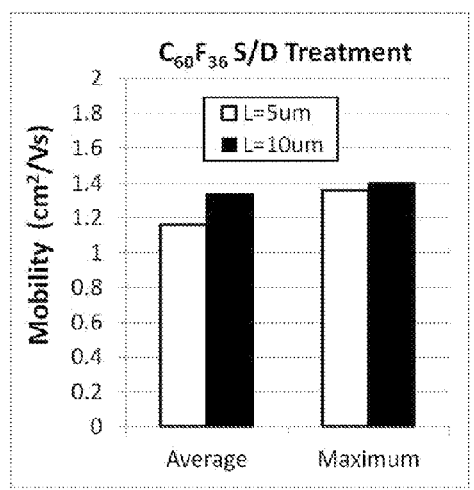
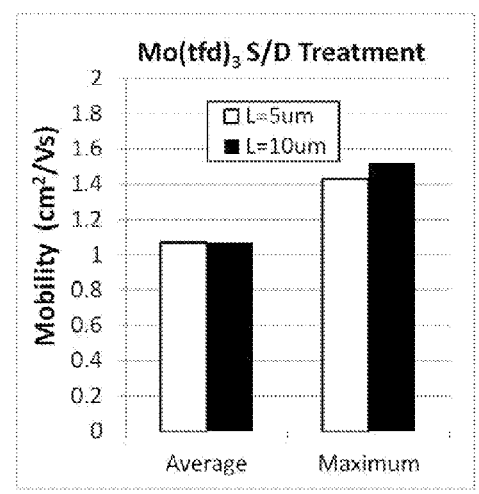
Fig. 4a          Fig. 4b

ELECTRODE SURFACE MODIFICATION LAYER FOR ELECTRONIC DEVICES

RELATED APPLICATIONS

The present application is a national stage filing under 35 U.S.C. §371 of international PCT application, PCT/GB2014/000283, filed Jul. 11, 2014, which claims priority to United Kingdom patent application, GB 1312609.9, filed Jul. 15, 2013, each of which is incorporated herein by reference.

FIELD OF THE INVENTION

The present invention relates to a method for preparing a modified electrode for an organic electronic device and to a method for preparing an organic electronic device incorporating the modified electrode. The invention is also concerned with a modified electrode per se and with an organic electronic device comprising the modified electrode.

BACKGROUND

Transistors may be formed by processes wherein their semiconducting layer, and in many cases, other layers is deposited from solution. The resulting transistors are called thin-film transistors. When an organic semiconductor is used in the semiconducting layer, the device is often described as an organic thin film transistor (OTFT).

Various arrangements for OTFTs are known. One device, a top-gate thin-film transistor, comprises source and drain electrodes with a semiconducting layer disposed therebetween in a channel region, a gate electrode disposed over the semiconducting layer and a layer of insulating material disposed between the gate electrode and the semiconductor in the channel region.

The conductivity of the channel region can be altered by the application of a voltage at the gate. In this way the transistor can be switched on and off using an applied gate voltage. The drain current that is achievable for a given voltage is dependent on the mobility of the charge carriers in the organic semiconductor in the active region of the transistor, namely the channel region between the source and drain electrodes. In order to achieve high drain currents with low operational voltages, organic thin film transistors must have an organic semiconducting layer which has highly mobile charge carriers in the channel region and an efficient means to inject charge from the electrode to the organic semiconducting layer.

In short channel length devices contact resistance can contribute a significant proportion to the total channel resistance in the device. The higher the contact resistance in the device, the higher the proportion of the applied voltage is dropped across the source and drain contacts and, as a result, the lower the bias across the channel region is achieved. A high contact resistance has the effect of a much lower current level being extracted from the device due to the lower bias applied across the channel region, and hence lower device mobility.

There are a number of different ways to reduce or minimise contact resistance. One approach is to dope the semiconducting layer, for example, with a p-dopant. Lee, Jae-Hyun et al. in Applied Physics Letters 98, 173303 (2011) and Qi, Yabing et al. in J. Am. Chem. Soc. 2009 131 12530-12531, for example, both disclose the doping of organic semiconducting layers with molybdenum tris-[1,2-bis(trifluoromethyl)ethane-1,2-dithiolene] $(Mo(tfd)_3)$. $Mo(tfd)_3$ has a low LUMO level of about 5.59 eV making charge transfer from the HOMO of an organic semiconductor to $Mo(tfd)_3$ energetically favourable in many cases. It is also recognised that $Mo(tfd)_3$ can be more uniformly distributed throughout organic semiconductors than metal oxide dopants resulting in higher charge generation efficiency.

Tiwari, S. P. et al. in Organic Electronics 11 (2010) 860-863 discloses the fabrication and characterisation of OFETs wherein a 10 nm co-evaporated layer of $Mo(tfd)_3$ and pentacene is deposited under the metal (Au) electrodes and over a pentacene semiconducting layer. Coevaporation is carried out through a shadow mask to define the source/drain electrodes. Tiwari, S. P. et al. hypothesise that selective doping near the electrode interface decreases interface resistance due to a reduction in the energy barrier height for carrier injection form the metal electrode to the semiconductor due to band bending associated with doping at the interface. Thus in the method of Tiwari, S. P. et al. the $Mo(tfd)_3$ migrates into and dopes the organic semiconducting layer as in Lee, Jau-Hyun and Qi, Yabing described above.

SUMMARY OF INVENTION

Viewed from a first aspect the present invention provides a method for preparing a modified electrode for an organic electronic device, wherein said modified electrode comprises a surface modification layer, comprising:
(i) depositing a solution comprising $M(tfd)_3$, wherein M is Mo, W or Cr, and at least one solvent onto at least a part of at least one surface of said electrode; and
(ii) removing at least some of said solvent to form said surface modification layer on said electrode.

Viewed from a further aspect the present invention provides a method for preparing an organic electronic device comprising:
(i) preparing at least one modified electrode by the method as hereinbefore defined; and
(ii) depositing an organic semiconducting layer comprising at least one organic semiconductor on the surface of the modified electrode.

Viewed from a further aspect the present invention provides an organic electronic device obtainable by a method as hereinbefore defined.

Viewed from a further aspect the present invention provides an organic thin film transistor comprising source and drain electrodes defining a channel region therebetween; a surface modification layer comprising $M(tfd)_3$, wherein M is Mo, W or Cr, in contact with at least a part of at least one surface of said source and drain electrodes; an organic semiconducting layer extending across the channel region and in contact with the surface modification layer; a gate electrode; and a gate dielectric between the organic semiconducting layer and the gate electrode.

Viewed from a further aspect the present invention provides use of a solution comprising $M(tfd)_3$, wherein M is Mo, W or Cr, and a solvent for the manufacture of a surface modification layer on an electrode.

Viewed from a further aspect the present invention provides a modified electrode obtainable by a method as hereinbefore defined.

Viewed from a further aspect the present invention provides a modified electrode comprising a surface modification layer in contact with at least a part of at least one surface thereof, wherein said surface modification layer comprises $M(tfd)_3$, wherein M is Mo, W or Cr.

Viewed from a further aspect the present invention provides use of a modified electrode as hereinbefore defined for the manufacture of an organic electronic device.

In preferred embodiments of the invention, M(tfd)$_3$ is Mo(tfd)$_3$.

DEFINITIONS

As used herein the term "modified electrode" refers to an electrode wherein at least a part of at least one surface of the electrode is modified by the presence of a compound that is not present in the body of the electrode.

As used herein the term "surface modification layer" refers to the layer of compound(s) that is deposited in contact with at least a part of the surface of the electrode. The layer may be continuous or discontinuous.

As used herein the term "monolayer" refers to a layer which is one molecule thick.

As used herein the term "work function" refers to the minimum quantity of energy that is required to remove an electron to infinity from the surface of a metal.

As used herein the term "semiconductor" refers to a compound whose conductivity can be modified by temperature, by controlled addition of impurities or by application of electrical fields or light. The term "semiconducting layer" refers to a continuous film of material that is semiconducting. The semiconducting layer formed in the present invention preferably comprises a mixture or blend of polymer and non-polymeric semiconductors. Preferably the polymer forms a matrix in which the non-polymeric semiconductor is dispersed.

As used herein the term "polymer" refers to a compound which has a polydispersity of greater than 1.

As used herein the term "polymeric semiconductor" refers to polymeric compounds comprising repeating units that are semiconductors.

As used herein the term "non-polymeric semiconductor" refers to small molecule compounds that are semiconductors. The term includes dendrimeric and oligomeric compounds (e.g. dimers, trimers, tetramers and pentamers) that have a polydispersity of 1. Preferred non-polymeric semiconductors are crystalline. Preferred non-polymeric semiconductors are organic.

As used herein the term "solution" refers to a homogeneous mixture of a compound or blend in a solvent.

As used herein the term "blend" refers to a mixture of at least two compounds and/or polymers. Generally a blend will be a solid, e.g. powder.

As used herein the term "aromatic solvent" refers to solvents comprising one or more compounds that comprise a planar ring that has $4n_{+}2$ pi electrons, wherein n is a zero or a positive integer.

As used herein the term "aromatic ring" refers to a planar ring that has $4n+2$ pi electrons, wherein n is a non-negative integer.

As used herein the term "alkyl" refers to saturated, straight chained, branched or cyclic groups. Alkyl groups may be substituted or unsubstituted.

As used herein the term "alkenyl" refers to unsaturated straight chained, branched or cyclic groups. Alkenyl groups may be substituted or unsubstituted.

As used herein the term "alkoxy" refers to O-alkyl groups, wherein alkyl is as defined above.

As used herein the term "amino" refers to primary (i.e. NH$_2$), secondary (NHR) and tertiary amino groups (NR$_2$) wherein R is alkyl as defined above.

As used herein the term "amido" refers to groups of the formulae —NHCOR and —NRCOR wherein each R, which may the same or different, is alkyl as defined above.

As used herein the term "silyl" refers to groups of the formulae -A-SiR'R"R'" wherein A is optionally present and is a saturated or unsaturated group selected from C$_{1-8}$ alkylene, C$_{1-8}$ alkenylene or C$_{1-8}$ alkynylene and each of R', R" and R'" is H or alkyl as defined above.

As used herein the term "stannyl" refers to groups of the formulae —Sn(R')$_r$ wherein r is 1, 2 or 3 and each R' is H or alkyl as defined above.

As used herein the term "halogen" encompasses atoms selected from the group consisting of F, Cl, Br and I.

As used herein, the term "aryl" refers to a group comprising at least one aromatic ring. The term aryl encompasses heteroaryl as well as fused ring systems wherein one or more aromatic ring is fused to a cycloalkyl ring. Aryl groups may be substituted or unsubstituted. An example of an aryl group is phenyl, i.e. C$_6$H$_5$. Phenyl groups may be substituted or unsubstituted.

As used herein the term "heteroaryl" refers to aryl groups comprising a heteroatom selected from N, O, S and Se. An example of a heteroaryl group is thiophene, i.e. C$_4$H$_4$S. It may be substituted or unsubstituted. A further example is benzothiophene, which has the following structure. It may also be substituted or unsubstituted.

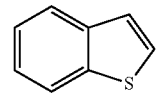

As used herein, the term "cycloalkyl" refers to a saturated or partially saturated mono- or bicyclic alkyl ring system containing 3 to 10 carbon atoms. Cycloalkyl groups may be substituted or unsubstituted.

As used herein the term "fullerene" refers to a compound composed entirely of carbon in the form of a hollow sphere, ellipsoid or tube.

DESCRIPTION OF THE INVENTION

In the methods of the present invention a modified electrode, preferably a metal electrode, for an organic electronic device is prepared. The modified electrode comprises a surface modification layer in contact with at least a part of at least one surface of the electrode. The presence of the surface modification layer advantageously improves charge injection from the electrode into an overlying organic semiconducting layer. Charge injection is improved by increasing the work function of the metal electrode. The mechanism underlying the present invention is therefore believed to be different from that of the prior art discussed above wherein p-dopants are doped into the organic semiconducting later to improve charge mobility.

In preferred methods of the invention the surface modification layer has a thickness of less than 10 nm, more preferably less than 7.5 nm, still more preferably less than 5 nm and yet more preferably less than 2.5 nm. The minimum thickness of the surface modification layer may, for example, be 1 nm. In particularly preferred methods the surface modification layer is a monolayer.

The surface modification layer is prepared by depositing a solution comprising molybdenum tris-[1,2-bis(trifluoromethyl)ethane-1,2-dithiolene] (Mo(tfd)$_3$), chromium tris-[1,2-bis(trifluoromethyl)ethane-1,2-dithiolene] (Cr(tfd)$_3$) or tungsten tris-[1,2-bis(trifluoromethyl)ethane-1,2-dithiolene] (W(tfd)$_3$) and at least one solvent onto at least a part of at least one surface of the electrode. Molybdenum tris-[1,2-bis (trifluoromethyl)ethane-1,2-dithiolene] (Mo(tfd)$_3$) is preferred. The structure of Mo(tfd)$_3$ is shown below:

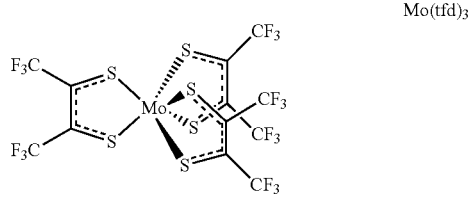

Mo(tfd)$_3$ may be prepared by syntheses disclosed in the literature, e.g. as described in Inorganic Syntheses, Volume 10, Part 1, Chapter 1, p 8-26 "Metal complexes derived from cis-1,2-dicyano-1,2-ethylenedithiolate and bis(trifluoromethyl)-1,2-dithiete", by A. Davison, R. H. Holm, R. E. Benson and W. Mahler. The chromium and tungsten complexes may be prepared by analogous processes.

Mo(tfd)$_3$ is a strong electron acceptor due to a deep electron affinity of 5.6 eV. When present in a surface modification layer on an electrode, Mo(tfd)$_3$ causes a shift in the work function, specifically an increase in the work function, of the electrode. Without wishing to be bound by theory this is thought to be due to the Mo(tfd)$_3$ forming a charge transfer complex on the metal surface resulting in a shift in the relative vacuum level at the metal surface and improved matching to the frontier molecular energy levels of the overlying organic semiconducting layer. It is believed that Cr(tfd)$_3$ and W(tfd)$_3$ work by an analogous mechanism.

The M(tfd)$_3$, wherein M is Mo, Cr or W, is deposited onto at least a part of at least one surface of the electrode in a solution. An advantage of the method of the invention is that solution-processing techniques may be employed. This is particularly beneficial when the modified electrode is incorporated into an organic electronic device having a short channel length, e.g. <10 µm. The solvent(s) present in the solution may be any solvent in which M(tfd)$_3$, wherein M is Mo, Cr or W, is soluble. Preferably the solvent present in the solution is aromatic or polar.

Suitable aromatic solvents are commercially available from a range of suppliers. Anhydrous grade solvents are typically selected. Preferably the aromatic solvent is a $C_{1-6}$ alkyl benzene. Optionally the $C_{1-6}$ alkyl benzene is further substituted. Representative examples of further substituents include $C_{1-6}$ alkyl, $OC_{1-6}$ alkyl and $C(O)OC_{1-6}$ alkyl, preferably $C_{1-6}$ alkyl. Preferably the aromatic solvent is selected from the group consisting of toluene, o-xylene, m-xylene, p-xylene, anisole (or methoxybenzene) and mesitylene. Particularly preferably the aromatic solvent is selected from toluene, o-xylene, m-xylene or p-xylene. Still more preferably the aromatic solvent is toluene or o-xylene.

The concentration of M(tfd)$_3$, wherein M is Mo, Cr or W, in the solution is preferably in the range 0.1 to 10 mg M(tfd)$_3$ per 1 ml of solvent, still more preferably 0.2 to 5 mg M(tfd)$_3$ per 1 ml of solvent, yet more preferably 0.5 to 2.5 mg M(tfd)$_3$ per 1 ml of solvent and even yet more preferably about 1 mg M(tfd)$_3$ per 1 ml of solvent. The solution comprising M(tfd)$_3$, wherein M is Mo, Cr or W, that is deposited in contact with at least a part of at least one surface of the electrode preferably consists essentially of (e.g. consists of) M(tfd)$_3$, wherein M is Mo, Cr or W, and solvent.

In the methods of the present invention the solution comprising M(tfd)$_3$, wherein M is Mo, Cr or W, and solvent may be deposited by any conventional solution processing technique. Representative examples of solution-based processing methods include spin coating, dip coating, slot die coating, doctor blade coating, ink-jet printing, flexographic printing, gravure printing and roll to roll printing. The main objective of the deposition method is to facilitate the adsorption of M(tfd)$_3$, wherein M is Mo, Cr or W, onto the metal contact via an immersion process.

In preferred methods of the invention the solution comprising M(tfd)$_3$, wherein M is Mo, Cr or W, and solvent is deposited on the electrode by immersing the electrode in the solution. Preferably the electrode is immersed in the solution for 1 to 10 minutes, more preferably 2 to 8 minutes and still more preferably 3 to 6 minutes.

Further preferred methods of the invention further comprise the step of rinsing the electrode to remove non-adsorbed M(tfd)$_3$, wherein M is Mo, Cr or W, that may reside either on the electrode or channel regions of the device substrate. Thus following immersion the electrode is preferably rinsed. This rinsing step preferably removes M(tfd)$_3$, wherein M is Mo, Cr or W, from, e.g. the channel region in between the electrodes. Preferably the solvent used for rinsing is aromatic or polar. Particularly preferably the solvent used for rinsing is the same solvent that is present in the solution comprising M(tfd)$_3$, wherein M is Mo, Cr or W.

The methods of the invention further comprise the step of removing at least some, preferably substantially all, e.g. all, of the solvent from the substrate. Preferably the step of removing the solvent is carried out by heating, annealing (e.g. with microwave radiation), applying a vacuum or any combination thereof. The skilled man in the art is readily able to ascertain suitable conditions to ensure rapid drying of the substrate.

Thus particularly preferred methods of the present invention comprise:

(i) depositing a solution comprising M(tfd)$_3$, wherein M is Mo, Cr or W, and at least one solvent onto at least a part of at least one surface of said electrode surface (e.g. immersing an electrode in a solution comprising M(tfd)$_3$, wherein M is Mo, Cr or W, and at least one solvent);

(ii) rinsing said electrode to remove non-adsorbed M(tfd)$_3$, wherein M is Mo, Cr or W; and (iii) removing at least some of said solvent to form said surface modification layer on the electrode.

An advantage of the solution-based methods of the present invention is that devices with a short channel length, e.g. 5 or 10 µm, can be readily prepared. This is in contrast to prior art techniques based on thermal evaporation which requires the use of shadow masks, therefore limiting the channel length resolution and additionally providing mask alignment inaccuracies.

In preferred methods of the invention the surface modification layer is formed on the entirety of at least one surface of the electrode. In further preferred methods of the invention the surface modification layer is formed on the entirety of all of the surfaces of the electrode. This is advantageous since once incorporated into a device the surfaces of the sides of the electrode are typically in contact with an organic semiconducting layer in the channel region. The surface modification layer preferably reduces the barrier for charge injection from the electrode to the organic semiconducting layer by altering the work function of the source and drain electrodes.

In the methods of the present invention the surface modification layer is adsorbed onto the surface(s) of the electrode. The surface modification layer preferably forms a discrete coating on the surface(s) of the electrode and is adhered thereto. Preferably the M(tfd)$_3$, wherein M is Mo, Cr or W, present in the surface modification layer does not migrate into an overlying organic semiconducting layer. Correspondingly the surface modification layer preferably does not comprise any organic semiconductor. Particularly preferably the surface modification layer consists of M(tfd)$_3$, wherein M is Mo, Cr or W. This highlights the fact that the mechanism by which charge injection from the modified electrode to an overlying organic semiconducting layer relies on shifting, specifically increasing the work function of the metal, rather than on doping of the organic semiconducting layer.

The electrode that the surface modification layer comprising M(tfd)$_3$, wherein M is Mo, Cr or W, is deposited onto in the methods of the invention may comprise any conductive material wherein the LUMO level of the M(tfd)$_3$, wherein M is Mo, Cr or W, is deeper (i.e. further from the vacuum level) than the work function of the electrode. Representative examples of suitable electrode materials include silver, gold, nickel, copper, indium-tin-oxide, fluorinated tin oxide and mixtures and alloys thereof. Preferably the electrode comprises gold, silver or copper.

As described above, the methods of the present invention increase the work function of the electrode. Preferably the methods of the invention increase the work function of the electrode by at least 0.5 eV relative to the work function of the unmodified electrode. Particularly preferably the methods of the invention increase the work function of the electrode by 0.5 to 2 eV, more preferably 0.7 to 1.5 eV and still more preferably 0.8 to 1.2 eV. Improved energy level matching is brought about by a shift in the relative work function of the metal contact. This is determined by the shift in the relative vacuum level presented to the semiconductor material that arises from the modified metal contact. When the semiconductor material is brought into contact with such a modified electrode, the charge injection is improved via an effective shift in the HOMO level of the semiconductor material with reference to that of the vacuum level of the unmodified metal contact.

The invention also relates to a modified electrode comprising a surface modification layer in contact with at least a part of at least one surface thereof, wherein said surface modification layer comprises M(tfd)$_3$, wherein M is Mo, Cr or W. Preferred features of the modified electrode are the same as those set out above in relation to the preferred method for making the modified electrode.

The modified electrode of the present invention is preferably incorporated into a method for preparing an organic electronic device. The method for preparing an organic electronic device further comprises depositing an organic semiconducting layer comprising at least one organic semiconductor on the surface of the modified electrode. Preferably the organic semiconducting layer is deposited from solution. Preferably the method further comprises a step of removing at least some, more preferably substantially all, e.g. all, of the solvent to form the organic semiconducting layer.

In preferred methods of the invention the organic semiconducting layer comprises a polymeric semiconductor and at least one non-polymeric semiconductor, e.g. one non-polymeric semiconductor.

The non-polymeric semiconductors present in the present invention preferably comprise a core of at least three fused rings wherein each ring is independently selected from aromatic rings and heteroaromatic rings that are each individually unsubstituted or substituted with one or more substituents. Exemplary substituents include $C_{1-12}$ alkyl groups, $C_{1-12}$ alkoxy groups, halogens (e.g. F), or silyl groups including trialkylsilyl and trialkylsilylethynyl.

Preferably the non-polymeric semiconductor is a benzothiophene derivative and more preferably a benzothiophene derivative of formula (I):

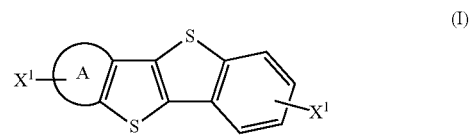

wherein A is a phenyl group or a thiophene group, said phenyl group or thiophene group optionally being fused with a phenyl group or a thiophene group which can be unsubstituted or substituted with at least one group of formula $X^1$ and/or fused with a group selected from a phenyl group, a thiophene group and a benzothiophene group, any of said phenyl, thiophene and benzothiophene groups being unsubstituted or substituted with at least one group of formula $X^1$; and each group $X^1$ may be the same or different and is selected from the group consisting of (i) unsubstituted or substituted straight, branched or cyclic alkyl groups having from 1 to 20 carbon atoms, alkoxy groups having from 1 to 12 carbon atoms, amino groups that may be unsubstituted or substituted with one or two alkyl groups having from 1 to 8 carbon atoms, each of which may be the same or different, amido groups, silyl groups, unsubstituted or substituted alkenyl groups having from 2 to 12 carbon atoms and unsubstituted or substituted alkynyl groups having from 2 to 12 carbon atoms, or (ii) a polymerisable or reactive group selected from the group consisting of halogens, boronic acids, diboronic acids and esters of boronic acids and diboronic acids, alkenyl groups having from 2 to 12 carbon atoms and stannyl groups.

Examples of alkyl groups include methyl, ethyl, propyl, butyl, pentyl, hexyl, heptyl, octyl, nonyl or decyl. Examples of alkoxy groups include methoxy, ethoxy, propoxy, isopropoxy and butoxy. Examples of amino groups include amino, methylamino, ethylamino and methylethylamino. Examples of silyl groups include trialkylsilyl and trialkylsilylethynyl. Examples of alkenyl groups include ethenyl, propenyl and 2-methylpropenyl.

Possible substituents on the afore-mentioned $X^1$ groups include alkoxy groups having from 1 to 12 carbon atoms, halogen atoms, amino groups that may be unsubstituted or substituted with one or two alkyl groups that may be the same or different and each having from 1 to 8 carbon atoms, acylamino groups having from 2 to 12 carbon atoms, nitro groups, alkoxycarbonyl groups having from 2 to 7 carbon atoms, carboxyl groups, aryl groups having from 5 to 14 carbon atoms and 5- to 7-membered heteroaryl groups containing from 1 to 3 sulphur atoms, oxygen atoms, selenium atoms and/or nitrogen atoms.

In preferred benzothiophene derivatives of formula (I) A is selected from:
a thiophene group that is fused with a phenyl group substituted with at least one group of formula $X^1$; or
a phenyl group that may be unsubstituted or substituted with at least one group of formula $X^1$, said phenyl group further optionally being fused with a thiophene group which can be unsubstituted or substituted with at least one group of formula $X^1$ and/or fused with a benzothiophene group, said benzothiophene group being unsubstituted or substituted with at least one group of formula $X^1$.

In particularly preferred benzothiophene derivatives A is a thiophene group that is fused with a phenyl group substituted with at least one group of formula $X^1$.

Examples of preferred non-polymeric semiconductors are shown below:

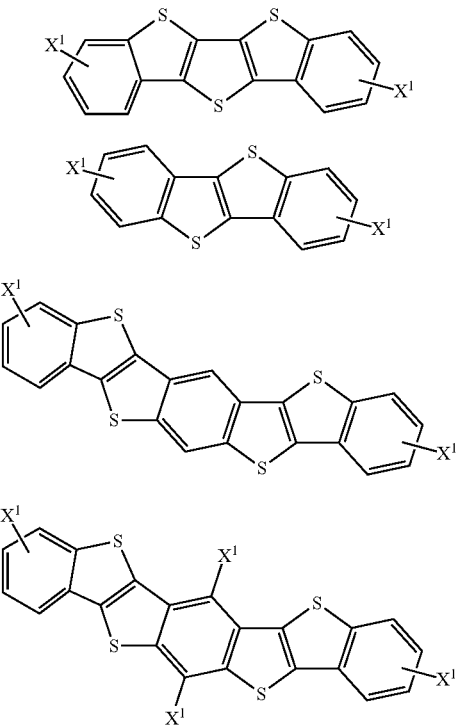

wherein $X^1$ is as defined above in relation to formulae (I). More preferably the non-polymeric semiconductor is of formula (Ia):

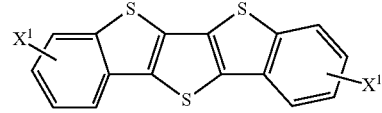

wherein each group $X^1$ may be the same or different and is selected from the group consisting of unsubstituted or substituted straight, branched or cyclic alkyl groups having from 1 to 20 carbon atoms, alkoxy groups having from 1 to 12 carbon atoms, amino groups that may be unsubstituted or substituted with one or two alkyl groups having from 1 to 8 carbon atoms, each of which may be the same or different, amido groups, silyl groups and alkenyl groups having from 2 to 12 carbon atoms. Still more preferably the non-polymeric semiconductor is of formula (Iai):

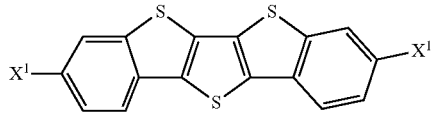

wherein each group $X^1$ may be the same or different and is selected from the group consisting of unsubstituted or substituted straight, branched or cyclic alkyl groups having from 1 to 20 carbon atoms, alkoxy groups having from 1 to 12 carbon atoms, amino groups that may be unsubstituted or substituted with one or two alkyl groups having from 1 to 8 carbon atoms, each of which may be the same or different, amido groups, silyl groups and alkenyl groups having from 2 to 12 carbon atoms.

Preferably the non-polymeric semiconductor is of formula (Iai), wherein each group $X^1$ is identical.

In preferred non-polymeric semiconductors of formula (Ia) or (Iai), especially (Iai), each group $X^1$ is an unsubstituted or substituted straight, branched or cyclic alkyl groups having from 1 to 20 carbon atoms. Still more preferably each group $X^1$ is a straight alkyl group. Yet more preferably each group $X^1$ is an unsubstituted alkyl group. Alkyl group comprises 1 to 16 carbon atoms, and more preferably 2 to 12 carbon atoms are preferred.

Particularly preferably the non-polymeric semiconductor is of formula (Ia) or (Iai), especially (Iai), wherein each group $X^1$ is a group of the formula $C_n H_{2n+1}$ wherein n is an integer between 1 and 16. Still more preferably the non-polymeric semiconductor is of formula (Ia) or (Iai), especially (Iai), wherein within each group $X^1$ is identical and is a group of the formula $C_n H_{2n+1}$ wherein n is an integer between 1 and 16, more preferably between 2 and 14, still more preferably between 4 and 12 and yet more preferably between 5 and 10.

Representative examples of suitable non-polymeric semiconductors include:

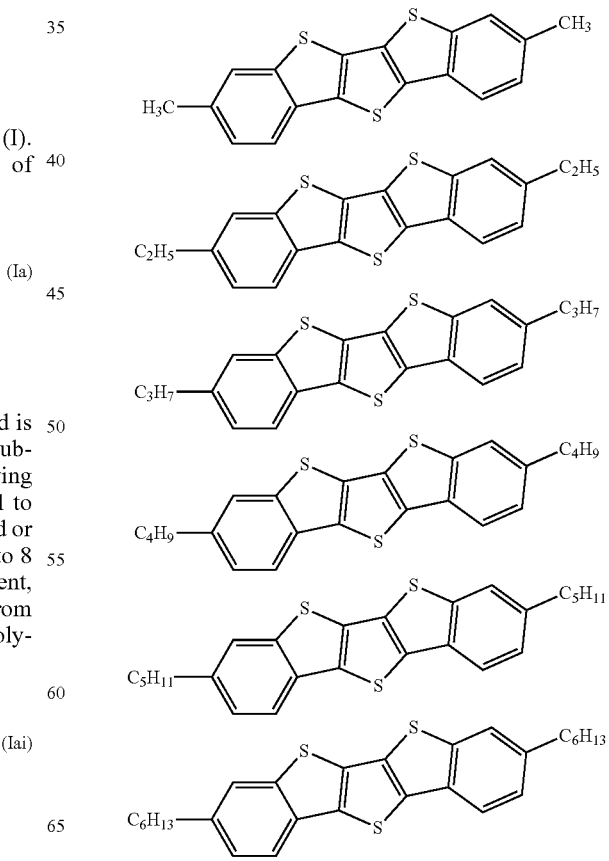

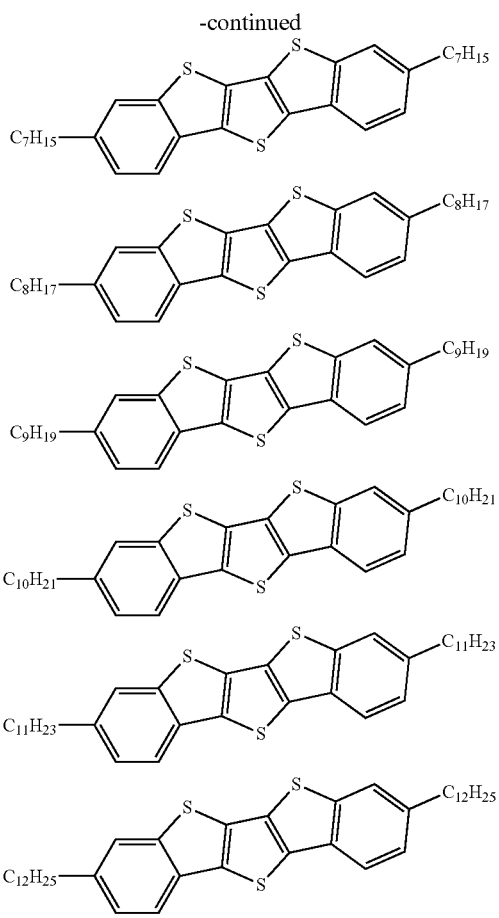

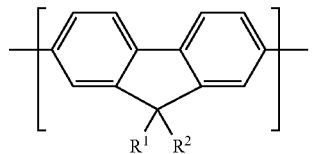
(II)

wherein $R^1$ and $R^2$ are the same or different and each is selected from the group consisting of hydrogen, an alkyl group having from 1 to 16 carbon atoms, an aryl group having from 5 to 14 carbon atoms and a 5- to 7-membered heteroaryl group containing from 1 to 3 sulphur atoms, oxygen atoms, nitrogen atoms and/or selenium atoms, said aryl group or heteroaryl group being unsubstituted or substituted with one or more substituents selected from an alkyl group having from 1 to 16 carbon atoms and an alkoxy group having from 1 to 16 carbon atoms.

Examples of alkyl groups include methyl, ethyl, propyl, butyl, pentyl, hexyl, heptyl, octyl, nonyl or decyl. Examples of aryl groups include phenyl, indenyl, naphthyl, phenanthrenyl and anthracenyl groups. Examples of 5- to 7-membered heteroaryl groups include furyl, thienyl, pyrrolyl, azepinyl, pyrazolyl, imidazolyl, oxazolyl, isoxazolyl, thiazolyl, isothiazolyl, 1,2,3-oxadiazolyl, triazolyl, tetrazolyl, thiadiazolyl, pyranyl, pyridyl, pyridazinyl, pyrimidinyl and pyrazinyl groups. Examples of alkoxy groups include methoxy, ethoxy, propoxy, isopropoxy and butoxy.

In preferred polymeric semiconductors $R^1$ and $R^2$ are the same.

Preferred polymeric semiconductors comprise a repeat unit of formula (II) wherein, wherein $R^1$ and $R^2$ are each selected from the group consisting of hydrogen, an alkyl group having from 1 to 12 carbon atoms and a phenyl group, said phenyl group being unsubstituted or substituted with one or more substituents selected from an alkyl group having from 1 to 12 carbon atoms and an alkoxy group having from 1 to 12 carbon atoms. Still more preferred polymeric semiconductors comprise a repeat unit of formula (II) wherein $R^1$ and $R^2$ are each selected from the group consisting of an alkyl group having from 4 to 12 carbon atoms and a phenyl group, said phenyl group being unsubstituted or substituted with one or more substituents selected from an alkyl group having from 4 to 8 carbon atoms and an alkoxy group having from 4 to 8 carbon atoms. Yet further preferred polymeric semiconductors comprise a repeat unit of formula (II) wherein $R^1$ and $R^2$ are each selected from the group consisting of an alkyl group having from 4 to 12 carbon atoms, preferably butyl, pentyl, hexyl, heptyl, octyl, nonyl or decyl, particularly octyl, e.g. n-ocytyl.

Further preferred semiconducting polymers comprise a repeat unit of formula (III):

Particularly preferably the non-polymeric semiconductor is:

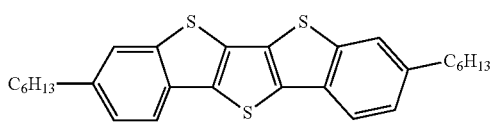

Suitable non-polymeric semiconductors for use in the present invention may be prepared by conventional techniques.

The polymeric semiconductor present in the organic semiconducting layer may be any known polymeric semiconductor suitable for processing from solution. Examples of polymeric semiconductors known to the skilled person are described in prior art such as Smith et. al., Applied Physics Letters, Vol 93, 253301 (2008); Russell et. al., Applied Physics Letters, Vol 87, 222109 (2005); Ohe et. al., Applied Physics Letters, Vol 93, 053303 (2008); Madec et. al., Journal of Surface Science & Nanotechnology, Vol 7, 455-458 (2009); and Kang et. al., J. Am. Chem. Soc., Vol 130, 12273-75 (2008).

Suitable polymeric semiconductors are commercially available.

Preferably the polymeric semiconductor is a conjugated polymer. Preferably the polymeric semiconductor comprises a repeat unit of formula (II)

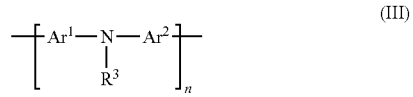
(III)

wherein $Ar^1$ and $Ar^2$ are the same or different and each is selected from an aryl group having from 5 to 14 carbon atoms and a 5- to 7-membered heteroaryl group containing from 1 to 3 sulphur atoms, oxygen atoms, nitrogen atoms and/or selenium atoms, said aryl group or heteroaryl group being unsubstituted or substituted with one or more substituents selected from an alkyl group having from 1 to 16 carbon atoms and an alkoxy group having from 1 to 16 carbon atoms;

$R^3$ is an alkyl group having from 1 to 8 carbon atoms or a phenyl group which may be unsubstituted or substituted with an alkyl group having from 1 to 8 carbon atoms; and n is an integer greater than or equal to 1, preferably 1 or 2.

Examples of aryl groups include phenyl, indenyl, naphthyl, phenanthrenyl and anthracenyl groups. Examples of 5- to 7-membered heteroaryl groups include furyl, thienyl, pyrrolyl, azepinyl, pyrazolyl, imidazolyl, oxazolyl, isoxazolyl, thiazolyl, isothiazolyl, 1,2,3-oxadiazolyl, triazolyl, tetrazolyl, thiadiazolyl, pyranyl, pyridyl, pyridazinyl, pyrimidinyl and pyrazinyl groups. Examples of alkyl groups include methyl, ethyl, propyl, butyl, pentyl, hexyl, heptyl, octyl, nonyl or decyl. Examples of alkoxy groups include methoxy, ethoxy, propoxy, isopropoxy and butoxy.

In preferred polymeric semiconductors comprising a repeat unit of formula (III) $Ar^1$ and $Ar^2$ are the same. Particularly preferably each of $Ar^1$ and $Ar^2$ is a phenyl group, preferably an unsubstituted phenyl group.

In further preferred polymeric semiconductors comprising a repeat unit of formula (III) $R^3$ is an alkyl group having from 1 to 8 carbon atoms or a phenyl group which may be unsubstituted or substituted with an alkyl group having from 1 to 8 carbon atoms. Particularly preferably $R^3$ is alkyl group, especially an alkyl group comprising 2 to 5 carbon atoms, e.g. ethyl, propyl, butyl, pentyl. Still more preferably $R^3$ is a phenyl group substituted with an alkyl group having from 1 to 8 carbon atoms, e. g. ethyl, propyl, butyl, pentyl.

Still more preferably the polymeric semiconductor present in the blend of the present invention comprises a repeat unit of formula (II) and a repeat unit of formula (III). Preferably the ratio of repeat unit of formula (II) to formula (III) is in the range 3:1 to 1:3, more preferably 2:1 to 1:2 and still more preferably about 1:1. Particularly preferably the polymeric semiconductor comprises a repeat unit of formula (IV):

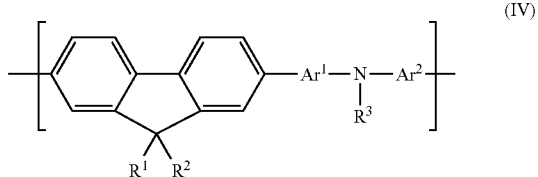

(IV)

wherein $R^1$, $R^2$, $Ar^1$, $Ar^2$ and $R^3$ are as defined above in relation to formulae (II) and (III).

Yet more preferably the polymeric semiconductor is F-8 TFB [9,9'-dioctylfluorene-co-N-(4-butylphenyl)-diphenylamine]n, wherein n is greater than 100. Alternatively the polymeric semiconductor is F-8 PFB [(9,9-dioctylfluorene-co-bis-N,N-(4-butylphenyl)-bis-N,N-phenyl-1,4-phenylenediamine)n, wherein n is greater than 100

Preferably the weight ratio of the polymeric to non-polymeric semiconductor in the semiconducting layer is in the range 60:40 to 90:10, more preferably 70:30 to 85:15 and still more preferably about 75:25.

In further preferred methods of the invention, the organic semiconducting layer comprises a p-dopant. Representative examples of suitable p-dopants include Mo(tfd)$_3$, W(tfd)$_3$, Cr(tfd)$_3$, 2,3,5,6-tetrafluoro-7,7,8,8-tetracyanoquinodimethane (F4-TCNQ) and partially fluorinated fullerenes, examples include, but are not limited to $C_{60}F_{18}$, $C_{60}F_{36}$ and $C_{60}F_{48}$. Preferably the p-dopant is Mo(tfd)$_3$. When present the concentration of the p-dopant in organic semiconducting layer is preferably 0.1 to 5% wt, more preferably 0.5 to 2.5% wt and still more preferably 1 to 2% wt.

Deposition of the semiconducting layer is preferably carried out by solution processing. Preferably the solvent present in the solution is aromatic. Preferably the aromatic solvent is selected from a substituted benzene, a substituted naphthalene, a substituted tetrahydronaphthalene or a substituted or unsubstituted $C_{5-8}$ cycloalkylbenzene. Suitable aromatic solvents are commercially available from a range of suppliers. Anhydrous grade solvents are typically selected. Such solvents are generally able to form solutions of both polymeric and non-polymeric semiconductors.

Preferably the aromatic solvent is of formula (Va), (Vb), (Vc) or (Vd):

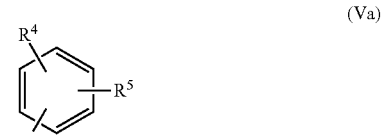

(Va)

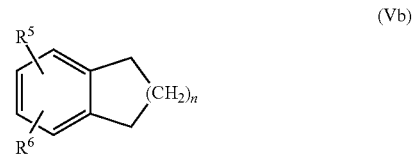

(Vb)

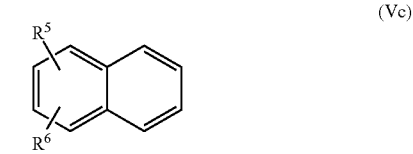

(Vc)

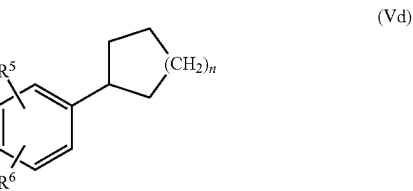

(Vd)

wherein
$R^4$ is selected from $C_{1-6}$ alkyl, $OC_{1-6}$ alkyl, or $C(O)OC_{1-6}$ alkyl; and
$R^5$ and $R^6$ are each independently selected from H, $C_{1-6}$ alkyl, $OC_{1-6}$ alkyl or $C(O)OC_{1-6}$ alkyl; and
n is 1, 2 or 3

In some preferred solvents of formula (Va) $R^4$ is $C_{1-6}$ alkyl. In further preferred solvents $R^5$ is H. In still further preferred solvents $R^6$ is $C_{1-6}$ alkyl, preferably methyl. Yet more preferably $R^4$ is $C_{1-6}$ alkyl, preferably methyl, $R^5$ is H and $R^6$ is $C_{1-6}$ alkyl.

In other preferred aromatic solvents of formula (Va), $R^4$ is $OC_{1-6}$ alkyl, particularly methoxy (OMe) or ethoxy (OEt). In further preferred solvents, $R^5$ is H, $C_{1-6}$ alkyl (e.g. methyl or ethyl) or $OC_{1-6}$ alkyl (e.g. methoxy or ethoxy). In still further preferred solvents $R^6$ is H. Particularly preferably $R^4$ is $OC_{1-6}$ alkyl, e.g. OMe or OEt, $R^5$ is $C_{1-6}$ alkyl, e.g. methyl or ethyl and $R^6$ is H or $R^4$ is $OC_{1-6}$ alkyl, e.g. OMe or OEt, $R^5$ is H and $R^6$.

In other preferred aromatic solvents $R^4$ is $C(O)OC_{1-6}$ alkyl, particularly C(O)OMe or C(O)OEt. In further preferred solvents $R^5$ is H or $C_{1-6}$ alkyl (e.g. methyl or ethyl).

In still further preferred solvents $R^6$ is H. Particularly preferably $R^4$ is $C(O)OC_{1-6}$ alkyl, e.g. $C(O)OMe$ or $C(O)OEt$, $R^5$ is H and $R^6$ is H.

In preferred aromatic solvents of formula (Vb), n is 1 or 2, particularly 2. In particularly preferred solvents, at least one of $R^5$ and $R^6$ is H. Still more preferably, both of $R^5$ and $R^6$ are H.

In preferred aromatic solvents of formula (Vc), at least one of $R^5$ and $R^6$ is $C_{1-6}$ alkyl. In further preferred solvents of formula (Vc) $R^5$ is H. In still further preferred solvents $R^6$ is $C_{1-6}$ alkyl, preferably methyl. Yet more preferably $R^5$ is H and $R^6$ is $C_{1-6}$ alkyl, preferably methyl.

In preferred aromatic solvents of formula (Vd), n is 1 or 2, particularly 2. In particularly preferred solvents, at least one of $R^5$ and $R^6$ is H. Still more preferably, both of $R^5$ and $R^6$ are H.

When the aromatic solvent is disubstituted, the substituents may be present in a [1,2], [1,3] or [1,4] substitution pattern. Preferably, however, the substituents are present in a [1,2] or ortho pattern. When the aromatic solvent is trisubstituted, the substituents are preferably present in a [1,3,5] substitution pattern.

Preferably the aromatic solvent is selected from the group consisting of toluene, o-xylene, m-xylene, p-xylene, anisole (or methoxybenzene), mesitylene, ethoxybenzene, 2-methylanisole, 3-methylanisole, 4-methylanisole, 1-ethoxy-2-methylbenzene, 1-ethoxy-3-methylbenzene, 1-ethoxy-4-methylbenzene, acetophenone, tetralin, 1,2-dimethoxybenzene, 1,3-dimethoxybenzene, 1,4-dimethoxybenzene, 1-methoxy-2-ethoxybenzene, 1-methoxy-3-ethoxybenzene, 1-methoxy-4-ethoxybenzene, ethyl benzoate, 1,2-diethoxybenzene, 2-methyl acetophenone, 3-methylacetophenone, 4-methylacetophenone, 2-ethylacetophenone, 3-ethylacetophenone, 4-ethylacetophenone, 1,3-diethoxybenzene, 1,4-diethoxybenzene, 2-methoxyacetophenone, 3-methoxyacetophenone, 4-methoxyacetophenone, ethyl 2-methylbenzoate, ethyl 3-methylbenzoate, ethyl 4-methylbenzoate, ethyl 2-ethylbenzoate, ethyl 3-ethylbenzoate, ethyl 4-ethylbenzoate, 1-methylnaphthalene and cyclohexylbenzene. Particularly preferably the aromatic solvent is selected from the group consisting of toluene, o-xylene, m-xylene, p-xylene, anisole (or methoxybenzene), mesitylene and tetralin.

In preferred solutions the total concentration of solids in the solvent is 0.8 to 3 1.0% w/v, more preferably 1.0 to 2.5% w/v and still more preferably it is 1.2 to 1.5% w/v.

The solutions may be prepared by conventional methods. Thus preferably the solutions are prepared by mixing (e.g. stirring or shaking) the non-polymeric semiconductor, the polymeric semiconductor and a solvent. Alternatively the solution may be prepared by mixing each of the components individually into a solvent. Heating of the solution may be required in order to ensure full dissolution of the solid into the solvent.

Deposition of the semiconducting layer is preferably carried out by solution processing. Any conventional solution-based processing method may be used. Representative examples of solution-based processing methods include spin coating, dip coating, slot die coating, doctor blade coating, ink-jet printing, flexographic printing, gravure printing or roll to roll printing. In preferred methods of the invention, however, film deposition is carried out by spin coating.

The parameters used for spin coating the semiconductor film such as spin coating speed, acceleration and time are selected on the basis of the target thickness for the semiconducting layer. Preferably the spin speed is 400 to 4000 rpm, more preferably 400 to 3000 rpm and still more preferably 400 to 2000 rpm. Preferably the spin time is 10 to 100 seconds, more preferably 15 to 60 seconds and still more preferably 30 to 60 seconds. Preferably the acceleration time from rest is less than 10 seconds, preferably less than 5 seconds and still more preferably less than 3 seconds. Any conventional spin coating apparatus may be used. The apparatus is used in a conventional manner.

Heating of the deposited solution to form the semiconducting layer is preferably carried out, e.g. on a hot plate. The heating step causes at least some (e.g. substantially all) of the solvent present in the solution to evaporate. Preferably the temperature of the hot plate in the heating step is 75 to 250° C., more preferably 80 to 150° C. and still more preferably 90 to 120° C. Preferably the heating time is 15 to 180 seconds, more preferably 30 to 120 seconds and still more preferably 45 to 90 seconds. Any conventional heating apparatus, e.g. hot plate, convection oven, vacuum assisted drying, may be used. The apparatus is used in a conventional manner. Heating may be carried out immediately after deposition or may be delayed.

Preferably the thickness of the semiconducting layer is 5 to 200 nm, more preferably 10 to 100 nm and still more preferably 20 to 70 nm.

The methods of the present invention are advantageous in the preparation of any organic electronic device wherein improved charge injection is beneficial. Preferably, however, the organic electronic device is an organic thin film transistor. The transistors are preferably p-type. Suitable transistor configurations include top-gate transistors and bottom-gate transistors.

In one preferred method the transistor is a top gate transistor. In such methods the source and drain electrodes having a channel region located in between them are preferably deposited on a substrate, and the semiconducting layer is deposited over at least a portion of the source and drain electrodes and in said channel region. Preferably at least one surface, of each of the electrodes is pre-coated with a surface-modification layer as described above. Preferably the method further comprises depositing a gate dielectric on the surface of the semiconducting layer. Still more preferably the method further comprises depositing a gate electrode on the gate dielectric.

A preferred method for making a top gate thin film transistor therefore comprises:
(i) depositing source and drain electrodes having a channel region located in between them on a substrate;
(ii) depositing a solution comprising $M(tfd)_3$, wherein M is Mo, Cr or W, and at least one solvent in contact with at least a part of at least one surface of said electrodes and removing at least some of said solvent to form a surface modification layer on said electrodes;
(iii) depositing a semiconducting layer over at least a portion of the source and drain electrodes and in said channel region;
(iv) depositing a gate dielectric on the surface of the semiconducting layer; and
(v) depositing a gate electrode on the gate dielectric.

In another preferred method the transistor is a bottom gate transistor. In such methods the source and drain electrodes having a channel region located in between them are deposited on a substrate on which a gate electrode and a gate dielectric have already been deposited, and the semiconducting layer is deposited over at least a portion of the source and drain electrodes and in the channel region. Preferably at least one surface of each of the electrodes is coated with a surface-modification layer as described above.

A preferred method of making a bottom gate thin film transistor therefore comprises:
(i) depositing a gate electrode on a substrate;
(ii) depositing a gate dielectric on the surface of the gate electrode;
(iii) depositing source and drain electrodes having a channel region located in between them on the gate dielectric;
(iv) depositing a solution comprising M(tfd)$_3$, wherein M is Mo, Cr or W, and at least one solvent in contact with at least a part of at least one surface of said electrodes and removing at least some of said solvent to form a surface modification layer on said electrodes; and
(v) depositing a semiconducting layer over at least a portion of the source and drain electrodes and in said channel region.

The electrodes (source, drain and gate) are preferably deposited by thermal evaporation. The source and drain electrodes are preferably 20 to 300 nm thick and more preferably 40 to 100 nm. The gate electrode is preferably 20 to 500 nm thick and more preferably 200 to 350 nm thick.

The gate dielectric is preferably deposited by spin coating. The gate dielectric is preferably 10 to 2000 nm thick and more preferably 10 to 400 nm.

The substrate may be any material conventionally used in the art such as glass or plastic (e.g. of PEN or PET type). Optionally the substrate is pre-treated to improve adhesion thereto.

The source, drain and gate electrodes may be selected from a wide range of conducting materials. Representative examples for a top gate device include a thin (preferably <10 nm) metal for adhesion to the substrate (e.g. chromium, titanium) followed by a working metal (e.g. gold, silver, copper), a metal alloy or a metal compound (e.g. indium tin oxide). Alternatively a conductive polymer may be used instead of the two layered approach using metals. Preferably the source, drain and gate electrodes are metal. More preferably the source and drain electrodes comprise a bi-layer of chromium and gold. Preferably the gate electrode is aluminium.

Representative examples of suitable gate dielectrics include polytetrafluoroethylene (PTFE), perfluoro cyclo oxyaliphatic polymer (CYTOP), perfluoroalkoxy polymer resin (PFA), fluorinated ethylene-propylene (FEP), polyethylenetetrafluoroethylene (ETFE), polyvinylfluoride (PVF), polyethylenechlorotrifluoroethylene (ECTFE), polyvinylidene fluoride (PVDF), polychlorotrifluoroethylene (PCTFE), perfluoro elastomers (FFKM) such as Kalrez (RTM) or Tecnoflon (RTM), fluoro elastomers such as Viton (RTM), perfluoropolyether (PFPE) and a polymer of tetrafluoroethylene, hexafluoropropylene and vinylidene fluoride (THV). Fluorinated polymers are an attractive choice for the dielectric, particularly in the field of organic thin film transistors (OTFTs), because they possess a number of favourable properties including: (i) excellent spin coating properties, for instance: (a) wetting on a wide variety of surfaces; and (b) film formation, with the option of doing multi-layer coatings; (ii) chemical inertness; (iii) quasi-total solvent orthogonality: consequently, the risk of the organic semiconductor being dissolved by the solvent used for spin-coating the dielectric is minimal; and (iv) high hydrophobicity: this can be advantageous because it results in low water uptake and low mobility of ionic contaminants in the fluorinated polymer dielectric (low hysteresis).

An organic thin film transistor of the present invention comprises source and drain electrodes defining a channel region therebetween; a surface modification layer comprising M(tfd)$_3$, wherein M is Mo, Cr or W, in contact with at least a part of at least one surface of said source and drain electrodes; an organic semiconducting layer extending across the channel region and in contact with the surface modification layer; a gate electrode; and a gate dielectric between the organic semiconducting layer and the gate dielectric. The device is preferably an organic thin-film transistor, e.g. a top gate thin film transistor.

A preferred device of the invention comprises:
i) a substrate;
ii) source and drain electrodes deposited on said substrate and having a channel region therebetween, wherein at least a part of at least one surface of each of said electrodes is modified with a surface modification layer comprising M(tfd)$_3$, wherein M is Mo, Cr or W;
iii) a semiconducting layer deposited over at least a portion of said source and drain electrodes and in said channel region;
iv) a gate dielectric deposited over said semiconducting layer; and
v) a gate electrode deposited on said gate dielectric.

A further preferred device of the invention comprises:
i) a substrate;
ii) a gate electrode deposited on said substrate;
iii) a gate dielectric deposited over said gate electrode and preferably said substrate;
iv) source and drain electrodes deposited on said gate dielectric and having a channel region therebetween, wherein at least a part of at least one surface of each of said electrodes is modified with a surface modification layer comprising M(tfd)$_3$, wherein M is Mo, Cr or W;
v) a semiconducting layer deposited over at least a portion of said source and drain electrodes and in said channel region.

Preferred devices and methods of the present invention have one or more of the following characteristics:
Substrate: Glass surface with chrome adhesion layer
Source and drain electrodes: Gold
Source and drain electrode thickness: 5 to 200 nm
Surface modification layer: Mo(tfd)$_3$
Surface modification layer thickness: <10 nm
Channel length: less than 20 microns, e.g. 10 or 5 microns
Semiconducting layer thickness: 30 to 80 nm
Gate dielectric: PTFE
Gate dielectric thickness: 50 to 500 nm
Gate electrode: Aluminium
Gate electrode thickness: 20 to 300 nm In short channel length (<20 µm) devices contact resistance can contribute a significant proportion to the total channel resistance in the device. The higher the contact resistance in the device, the higher the proportion of the applied voltage is dropped across the source and drain contacts and, as a result, the lower the bias across the channel region is achieved. A high contact resistance has the effect of a much lower current level being extracted from the device due to the lower bias applied across the channel region, and hence lower device mobility. The methods and devices of the present invention reduce contact resistance by increasing the effective work function of the metal. Improved energy level matching is brought about by a shift in the relative work function of the metal contact. This is determined by the shift in the relative vacuum level presented to the semiconductor material that arises from the modified metal contact. When the semiconductor material is brought into contact with such a modified electrode, the charge injection is improved via an effective shift in the HOMO level of the semiconductor material with reference to that of the vacuum level of the unmodified metal contact.

This is advantageous, especially in devices with short channel lengths, e.g. 10 µm or less such as 10 µm or 5 µm.

Preferably the saturation mobility (cm²V/s) of a top gate, bottom contact thin film transistor having a channel length of 10 microns and comprising a surface modification layer prepared by the method of the invention is at least 2 times, more preferably at least 3 times and still more preferably at least 4 times greater than the mobility of an identical transistor lacking the surface modification layer. More preferably the saturation mobility (cm²V/s) of a top gate, bottom contact thin film transistor having a channel length of 5 microns and comprising a surface modification layer prepared by the method of the invention is at least 2 times, more preferably at least 3 times and still more preferably at least 4 times greater than the mobility of an identical transistor lacking the surface modification layer.

Further preferred features of the devices of the present invention are those set out above as preferred features in relation to the method of making the devices.

The present invention also provides for the use of a solution comprising Mo(tfd)₃, wherein M is Mo, Cr or W, and a solvent for the manufacture of a surface modification layer on an electrode. Further, the present invention also provides for the use of a modified electrode obtainable by methods of the invention for the manufacture of an organic electronic device.

BRIEF DESCRIPTION OF THE DRAWINGS

FIG. 3a is a plot of photoelectron yield vs. photon energy for a gold layer;

FIG. 3b is a plot of photoelectron yield vs. photon energy for a gold layer with a surface modification layer comprising Mo(tfd)₃;

FIG. 4a shows a plot of saturation mobility (cm²V/s) obtained for top gate, bottom contact thin film transistors with a surface modification layer comprising a fullerene; and FIG. 4b shows a plot of saturation mobility (cm²V/s) obtained for top gate, bottom contact thin film transistors with a surface modification layer comprising Mo(tfd)₃ according to the present invention.

DETAILED DESCRIPTION OF THE INVENTION

Figure 1:
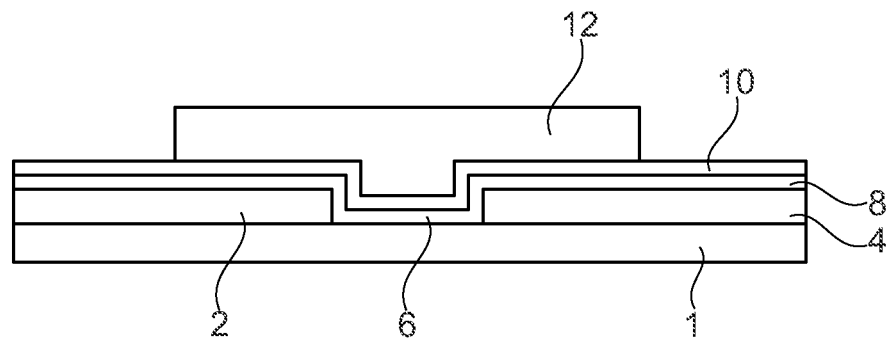
FIG. 1 is a schematic of a typical top gate thin film transistor.

Referring to FIG. 1, it shows a schematic of a top gate thin film transistor. The structure may be deposited on a substrate 1 and comprises source and drain electrodes 2, 4 which are spaced apart with a channel region 6 located therebetween. An organic semiconductor 8 is deposited in the channel region 6 and may extend over at least a portion of the source and drain electrodes 2, 4. A gate dielectric 10 is deposited over the organic semiconductor 8 and may extend over at least a portion of the source and drain electrodes 2, 4. Finally, a gate electrode 12 is deposited over the insulating layer 10. The gate electrode 12 is located over the channel region 6 and may extend over at least a portion of the source and drain electrodes 2, 4.

Figure 2:
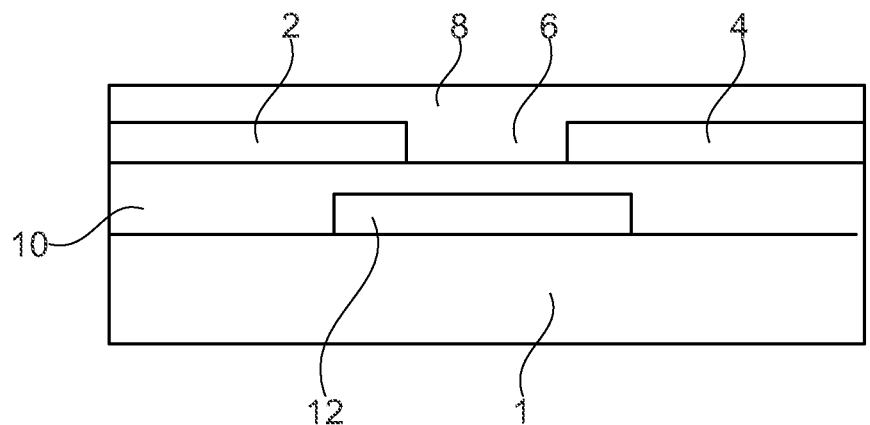
FIG. 2 is a schematic of a typical bottom gate thin film transistor.

FIG. 2 shows a schematic of a bottom gate thin film transistor. In FIG. 2 like reference numerals have been used for corresponding parts to FIG. 1. The bottom-gate structure illustrated in FIG. 2 comprises a gate electrode 12 deposited on a substrate 1 with a gate dielectric 10 deposited thereover. Source and drain electrodes 2, 4 are deposited over the insulating layer 10 of dielectric material. The source and drain electrodes 2, 4 are spaced apart with a channel region 6 located therebetween over the gate electrode. An organic semiconductor 8 is deposited in the channel region 6 and may extend over at least a portion of the source and drain electrodes 2, 4.

The conductivity of the channel region of the transistors can be altered by the application of a voltage at the gate. In this way the transistor can be switched on and off using an applied gate voltage. The drain current that is achievable for a given voltage is dependent on the injection of charge from the electrode into the organic semiconducting layer and on the mobility of the charge carriers in the channel region between the source and drain electrodes.

EXAMPLES

Materials

Toluene and o-xylene was obtained from Sigma-Aldrich.
Mo(tfd)₃ (shown below) was prepared by the method described in as described in Inorganic Syntheses, Volume 10, Part 1, Chapter 1, p 8-26 "Metal complexes derived from cis-1,2-dicyano-1,2-ethylenedithiolate and bis(trifluoromethyl)-1,2-dithiete", by A. Davison, R. H. Holm, R. E. Benson and W. Mahler.

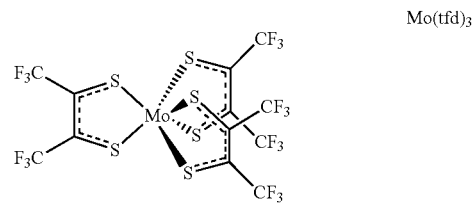

The substrate is glass obtained from Corning.
Gold is obtained from agar scientific 99.99%.
The organic semiconducting layer is described below.
The gate dielectric is PTFE. A commercially available PTFE is used.
Aluminium is obtained from Agar scientific 99.999%.

Determination of Work Function of Modified Electrodes

Samples were prepared by thermally evaporating gold (40 nm) onto a glass substrate. The substrates were immersed in a solution of Mo(tfd)₃ in toluene (1 mg/ml) for 5 minutes and then rinsed with toluene to remove any non-absorbed complex from the substrate and dried at 60° C. for 10 minutes. A comparative gold sample was left untreated.

The work function of the modified gold and the unmodified gold was measured using a photoelectron yield spectrometer (AC-2 photoelectron spectrometer available from Riken Instruments Inc.). Measurements were performed in air and produced plots of photoelectron yield vs. photon energy. The measurements were performed by probing a sample that is several square millimetres in area by the following steps:

UV photons emitted from a deuterium lamp were monochromatized through a grating monochromator The monochromatized UV photons at an intensity of 10 nW were focussed on the modified surface The energy of the UV photons was increased from 4.2 eV to 6.2 eV in steps of 0.05 eV When the energy of the UV photons was higher than the threshold energy of photoemission of the sample (i.e. the ionisation potential) photoelectrons were emitted from the sample surface Photoelectrons emitted from the sample were detected and counted in the air by an open air counter Photoemission threshold (i.e. work function) was determined from the energy of an intersecting point between a background line and an extrapolated line of the square root of the photoelectric quantum yield.

The results are shown in FIGS. 3a (unmodified gold) and 3b (modified gold). The results clearly show that a shift in work function occurs. More specifically the work function of gold is increased from 4.8 eV to 5.7 eV upon treatment with $Mo(tfd)_3$ solution. This is attributed to the adsorption of the $Mo(tfd)_3$ to the metal surface forming a charge transfer complex resulting in a shift in the relative vacuum level at the metal surface.

Preparative Example for the Fabrication of Organic Thin Film Transistors (i) Pre-Cleaning of OTFT Substrates and Surface Modification Treatments:

The first step in fabrication of the device required the pre-cleaning of the device substrates and the application of $Mo(tfd)_3$ in a surface treatment of the source and drain electrodes. The substrates consist of gold source and drain electrodes on top of a chrome adhesion layer on the glass surface (5/40 nm Cr/Au). The substrates were cleaned by oxygen plasma to ensure any residual photoresist material (used for the source-drain electrode definition) is removed.

After the plasma treatment, $Mo(tfd)_3$ was applied from a solution in toluene at a concentration of 1 mg/ml by flooding the substrate in the toluene solution for a period of 5 minutes. The solution was removed by spinning the substrate on a spin coater, then rinsing it in toluene to remove any unreacted material that had not adsorbed onto the source and drain electrodes and in the channel region of the substrate. All of these steps were performed in air. Samples were then baked at 60° C. for 10 minutes to ensure the samples were dehydrated.

(ii) Preparation and Spin-Coating of the Semiconductor Blend Solution:

A blend of non-polymeric semiconductor and polymeric semiconductor was prepared as a solution in o-xylene. The blend was prepared by making a solution of the desired concentration from the pre-weighed non-polymeric and polymeric semiconductors and the solvent. The blend was prepared to a concentration of 1.2% w/v (12 mg solid per 1 ml of solvent). The polymeric semiconductor was F8-TFB as disclosed above and in WO 2010/084977. The non-polymeric semiconductor was shown below and prepared in accordance with the methods disclosed in WO 2011/004869):

| Semiconductor | % by weight |
| --- | --- |
| F8-TFB, [9,9'-dioctylfluorene-co-N-(4-butylphenyl)-diphenylamine]n | 75 |
| (thienothiophene derivative with $C_6H_{13}$ groups) | 25 |

Deposition of this blend was made using a spin coater at a coating speed of 600 rpm for a period of 30 seconds. Drying was carried out immediately. The thickness of the layer was 55 nm.

(iii) Deposition of the Dielectric Layer:

A dielectric layer was then deposited by spin coating a solution of PTFE on this semiconductor film. The thickness of the dielectric layer was 300 nm.

(iv) Deposition of the Gate Electrode:

Finally the gate electrode was deposited by thermal evaporation of 300 nm aluminium through a shadow mask to give the desired top-gate organic thin film transistor.

Comparative Example

A comparative example was prepared wherein a fullerene was employed in the surface modification layer instead of $Mo(tfd)_3$. The fabrication method was identical except that after the plasma treatment, $C_{60}F_{36}$ was applied from a solution in toluene at a concentration of 1 mM by flooding the substrate in the toluene solution for a period of 5 minutes.

Device Characterisation

Devices produced as described above were measured in ambient conditions (no device encapsulation was used) using a Hewlett Packard 4156C semiconductor parameter analyser by measuring output and transfer device characteristics. Saturation mobility was calculated from the device when characterised at a drain bias of −40 V with respect to the source (0V) as a function of gate bias (swept from +40 V to −40V). The maximum in the mobility as a function of the gate bias is the peak saturation mobility. The results are shown in FIGS. 4a and 4b. Since many TFTs are used for the average (8 TFTs per channel length) an average and maximum data representation is shown. Firstly for each TFT the peak in the saturation mobility as a function of gate bias is identified (mobility is a gate bias dependent parameter). Both the average and the maximum (i.e. the single largest value in the peak saturation mobility for all TFTs considered) in these peak saturation mobility results are calculated and shown for both 5 and 10 micron channel length devices.

The average saturation mobility of the devices of the invention at channel lengths of 5 and 10 micrometres is about 1 $cm^2/Vs$. This is similar to the mobilities achieved in the comparative devices employing fullerene as a surface modification layer on the electrode.

At short channel lengths, the devices of the invention achieve a maximum charge carrier mobility of up to 1.5 $cm^2V/s$ at 10 micron channel length. The charge carrier mobility of the devices is improved from the application of a surface treatment layer giving rise to an increase in the effective work function of the electrode permitting a reduced contact resistance and therefore higher charge carrier mobility.

A width normalised contact resistance for the $Mo(tfd)_3$ treated contact devices was calculated using a standard transmission line method whereby the device resistance is calculated as a function of the device channel length. By extrapolating to a virtual zero channel length, the contact resistance was determined as 3.2 kOhm-cm.

The invention claimed is:

1. A method for preparing a modified electrode for an organic electronic device, wherein said modified electrode comprises a surface modification layer, comprising:
   (i) depositing a solution comprising $M(tfd)_3$, wherein M is Mo, Cr or W, and at least one solvent onto at least a part of at least one surface of an electrode; and
   (ii) removing at least some of said solvent to form said surface modification layer on said electrode.

2. The method as claimed in claim 1, wherein said surface modification layer does not comprise any organic semiconductor.

3. The method as claimed in claim 1, wherein said surface modification layer consists of M(tfd)$_3$, wherein M is Mo.

4. The method as claimed in claim 1, wherein said electrode comprises Au, Ag or Cu.

5. A method for preparing an organic electronic device comprising:
(i) preparing at least one modified electrode by the method of claim 1; and
(ii) depositing an organic semiconducting layer comprising at least one organic semiconductor on the surface of the modified electrode.

6. The method as claimed in claim 5, wherein said device is a thin film transistor.

7. The method as claimed in claim 5, wherein said organic semiconducting layer comprises a polymeric semiconductor and at least one non-polymeric semiconductor.

8. The method as claimed in claim 7, wherein said non-polymeric semiconductor is of formula (I):

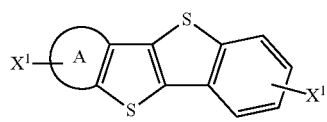

(I)

wherein A is a phenyl group or a thiophene group, said phenyl group or thiophene group optionally being fused with a phenyl group or a thiophene group which is unsubstituted or substituted with at least one group of formula X$^1$ and/or fused with a group selected from the group consisting of a phenyl group, a thiophene group, and a benzothiophene group, any of said phenyl, thiophene, and benzothiophene groups being unsubstituted or substituted with at least one group of formula X$^1$; and
wherein each group X$^1$ is the same or different and is (i) a group selected from the group consisting of unsubstituted or substituted straight, branched, or cyclic alkyl groups having from 1 to 20 carbon atoms, alkoxy groups having from 1 to 12 carbon atoms, amino groups that are unsubstituted or substituted with one or two alkyl groups having from 1 to 8 carbon atoms, each of which may be the same or different, amido groups, silyl groups, and alkenyl groups having from 2 to 12 carbon atoms, or (ii) a polymerisable or reactive group selected from the group consisting of halogens, boronic acids, diboronic acids, esters of boronic acids and diboronic acids, alkenyl groups having from 2 to 12 carbon atoms, and stannyl groups.

9. The method as claimed in claim 7, wherein said polymeric semiconductor comprises a repeat unit of formula (II):

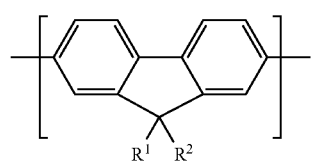

(II)

wherein R$^1$ and R$^2$ are the same or different and each is selected from the group consisting of hydrogen, an alkyl group having from 1 to 16 carbon atoms, an aryl group having from 5 to 14 carbon atoms, and a 5- to 7-membered heteroaryl group containing from 1 to 3 sulfur atoms, oxygen atoms, nitrogen atoms, and/or selenium atoms, said aryl group or heteroaryl group being unsubstituted or substituted with one or more substituents selected from the group consisting of an alkyl group having from 1 to 16 carbon atoms and an alkoxy group having from 1 to 16 carbon atoms;
and a repeat unit of formula (III):

(III)

wherein:
Ar$^1$ and Ar$^2$ are the same or different and each is selected from an aryl group having from 5 to 14 carbon atoms and a 5- to 7-membered heteroaryl group containing from 1 to 3 sulfur atoms, oxygen atoms, and/or nitrogen atoms, said aryl group or heteroaryl group being unsubstituted or substituted with one or more substituents selected from the group consisting of an alkyl group having from 1 to 16 carbon atoms and an alkoxy group having from 1 to 16 carbon atoms;
R$^3$ is an alkyl group having from 1 to 8 carbon atoms or a phenyl group which is unsubstituted or substituted with an alkyl group having from 1 to 8 carbon atoms; and n is an integer greater than or equal to 1.

10. The method as claimed in claim 7, wherein said polymeric semiconductor is F8-TFB ([9,9'-dioctylfluorene-co-N-(4-butylphenyl)-diphenylamine]$_n$), wherein n is greater than 100.

11. An organic electronic device obtainable by the method claim 5.

12. An organic thin film transistor comprising source and drain electrodes defining a channel region therebetween; a surface modification layer comprising M(tfd)$_3$, wherein M is Mo, Cr or W, in contact with at least a part of at least one surface of said source and drain electrodes; an organic semiconducting layer extending across the channel region and in contact with the surface modification layer; a gate electrode; and a gate dielectric between the organic semiconducting layer and the gate electrode.

13. The organic thin film transistor as claimed in claim 12, comprising:
i) a substrate;
ii) source and drain electrodes deposited on said substrate and having a channel region therebetween, wherein at least a part of at least one surface of each of said electrodes is modified with a surface modification layer comprising M(tfd)$_3$, wherein M is Mo, Cr or W;
iii) a semiconducting layer deposited over at least a portion of said source and drain electrodes and in said channel region;
iv) a gate dielectric deposited over said semiconducting layer; and
v) a gate electrode deposited on said gate dielectric.

14. The organic thin film transistor as claimed in claim 12, comprising:
i) a substrate;
ii) a gate electrode deposited on said substrate;
iii) a gate dielectric deposited over said gate electrode;
iv) source and drain electrodes deposited on said gate dielectric and having a channel region therebetween, wherein at least a part of at least one surface of each of said electrodes is modified with a surface modification layer comprising $M(tfd)_3$, wherein M is Mo, Cr or W; and v) a semiconducting layer deposited over at least a portion of said source and drain electrodes and in said channel region.

15. A modified electrode obtainable by the method of claim 1.

16. A modified electrode comprising an electrode; and a surface modification layer in contact with at least a part of at least one surface of said electrode, wherein said surface modification layer comprises $M(tfd)_3$, wherein M is Mo, Cr or W.

* * * * *